US010141424B2

(12) United States Patent
Coquand et al.

(10) Patent No.: US 10,141,424 B2
(45) Date of Patent: Nov. 27, 2018

(54) METHOD OF PRODUCING A CHANNEL STRUCTURE FORMED FROM A PLURALITY OF STRAINED SEMICONDUCTOR BARS

(71) Applicants: COMMISSARIAT A L'ENERGIE ATOMIQUE ET AUX ENERGIES ALTERNATIVES, Paris (FR); IBM CORPORATION, Yorktown Heights, NY (US)

(72) Inventors: Remi Coquand, Les Marches (FR); Emmanuel Augendre, Montbonnot (FR); Nicolas Loubet, Guilderland, NY (US); Shay Reboh, Guilderland, NY (US)

(73) Assignees: COMMISSARIAT A L'ENERGIE ATOMIQUE ET AUX ENERGIES ALTERNATIVES, Paris (FR); IBM CORPORATION, Yorktown Heights, NY (US)

( * ) Notice: Subject to any disclaimer, the term of this patent is extended or adjusted under 35 U.S.C. 154(b) by 0 days.

(21) Appl. No.: 15/603,738

(22) Filed: May 24, 2017

(65) Prior Publication Data

US 2017/0345915 A1    Nov. 30, 2017

(30) Foreign Application Priority Data

May 25, 2016 (FR) ..................... 16 54690

(51) Int. Cl.
*H01L 29/66* (2006.01)
*H01L 29/06* (2006.01)
(Continued)

(52) U.S. Cl.
CPC .. *H01L 29/66742* (2013.01); *H01L 21/02532* (2013.01); *H01L 21/02603* (2013.01);
(Continued)

(58) Field of Classification Search
CPC ......... H01L 29/66742; H01L 29/66545; H01L 29/78684; H01L 29/78651; H01L 21/3065;
(Continued)

(56) References Cited

U.S. PATENT DOCUMENTS

2011/0049473 A1    3/2011   Chidambarrao et al.
2013/0302955 A1   11/2013   Vinet et al.
(Continued)

FOREIGN PATENT DOCUMENTS

WO    WO 2013/095343 A1    6/2013
WO    WO 2015/050546 A1    4/2015

OTHER PUBLICATIONS

U.S. Appl. No. 15/490,212, filed Apr. 18, 2017, Shay Reboh et al.
(Continued)

*Primary Examiner* — Caleen Sullivan
(74) *Attorney, Agent, or Firm* — Oblon, McClelland, Maier & Neustadt, L.L.P.

(57) ABSTRACT

Method of manufacturing a structure with semiconducting bars suitable for forming one at least one transistor channel, including the following steps:
  a) make a semiconducting structure, composed of an alternation of first bars based on a first material and second bars based on a second material, the second material being a semiconducting material, then
  b) remove exposed portions of the structure based on the first material through an opening in a mask formed on the structure, the removal being made by selective etching in the opening of the first material relative to the second material, so as to expose a space around the second bars, then
  c) grow a given semiconducting material (25) around the second bars (6c) in the opening, the given semicon-
(Continued)

ducting material having a mesh parameter different from the mesh parameter of the second material (7) so as to induce a strain on the sheaths based on the given semiconducting material.

10 Claims, 6 Drawing Sheets

(51) Int. Cl.
    *H01L 29/423*     (2006.01)
    *H01L 29/786*     (2006.01)
    *H01L 21/02*     (2006.01)
    *H01L 21/3065*     (2006.01)
    *H01L 29/10*     (2006.01)

(52) U.S. Cl.
    CPC ...... *H01L 21/3065* (2013.01); *H01L 29/0673* (2013.01); *H01L 29/1054* (2013.01); *H01L 29/42392* (2013.01); *H01L 29/66545* (2013.01); *H01L 29/66772* (2013.01); *H01L 29/78651* (2013.01); *H01L 29/78654* (2013.01); *H01L 29/78684* (2013.01); *H01L 29/78696* (2013.01)

(58) Field of Classification Search
    CPC ......... H01L 21/02603; H01L 21/02532; H01L 29/42392; H01L 29/0673; H01L 29/78696
    USPC ....................................................... 438/151
    See application file for complete search history.

(56) References Cited

U.S. PATENT DOCUMENTS

| | | |
|---|---|---|
| 2014/0175379 A1 | 6/2014 | Chu-Kung et al. |
| 2014/0175543 A1 | 6/2014 | Glass et al. |
| 2014/0326952 A1 | 11/2014 | Kuhn et al. |
| 2015/0129830 A1* | 5/2015 | Sung ...................... B41N 10/04 257/9 |
| 2015/0155170 A1 | 6/2015 | Reboh et al. |
| 2015/0179474 A1 | 6/2015 | Maitrejean et al. |
| 2015/0179665 A1 | 6/2015 | Reboh et al. |
| 2016/0035849 A1 | 2/2016 | Ching et al. |
| 2016/0149039 A1 | 5/2016 | Reboh et al. |
| 2016/0211322 A1* | 7/2016 | Kim .................. H01L 29/66795 |
| 2016/0254362 A1 | 9/2016 | Maitrejean et al. |
| 2016/0276494 A1 | 9/2016 | Barraud et al. |
| 2016/0300927 A1 | 10/2016 | Reboh et al. |
| 2016/0372362 A1 | 12/2016 | Signamarcheix et al. |
| 2017/0076944 A1 | 3/2017 | Augendre et al. |
| 2017/0076997 A1 | 3/2017 | Reboh et al. |
| 2017/0141212 A1 | 5/2017 | Barraud et al. |

OTHER PUBLICATIONS

U.S. Appl. No. 15/457,447, filed Mar. 13, 2017, Emmanuel Augendre et al.
U.S. Appl. No. 15/452,049, filed Mar. 7, 2017, Sylvain Maitrejean et al.
U.S. Appl. No. 15/523,742, filed May 2, 2017, Shay Reboh et al.
French Preliminary Search Report dated Jan. 24, 2017 in French Application 16 54690 filed May 25, 2016 (with English Translation of Categories of Cited Documents).
P. Morin et al. "Mechanical Analyses of Extended and Localized UTBB Stressors Formed with Ge Enrichment Techniques," ECS Transactions, May 2015, pp. 10.
S. Bangsaruntip et al. "Density scaling with gate-all-around silicon nanowire MOSFETs for the 10 nm node and beyond," IEDM13-526, 2013, pp. 4.
S. Barraud et al. "Vertically Stacked-Nano Wires MOSFETs in a Replacement Metal Gate Process with Inner Spacer and SiGe Source/Drain," IEDM16-464, 2016, pp. 4.

\* cited by examiner

METHOD OF PRODUCING A CHANNEL STRUCTURE FORMED FROM A PLURALITY OF STRAINED SEMICONDUCTOR BARS

TECHNICAL FIELD AND PRIOR ART

This application is related to the field of strained semiconductor structures suitable for forming a transistor channel region in the form of a plurality of strained semiconducting elements.

It is known how to fabricate a transistor for which the channel structure is composed of a plurality of superposed semiconducting bars or nanowires.

Document FR 2 989° 515 presents an example of a method of making a transistor provided with this type of channel structure and a gate all around (GAA).

The channel structure may be formed from a stack of different semiconducting materials with at least one strained semiconducting material but its fabrication typically includes at least one etching step of bars that could lead to a relaxation phenomenon and the loss of stress.

PRESENTATION OF THE INVENTION

One embodiment of the invention comprises a method of manufacturing a structure with semiconducting bars suitable for forming at least a transistor channel, the method including the following steps:

a) provide at least a semiconducting structure on a substrate, composed of an alternation of first bars based on at least one first material and second bars based on at least a second material, the second material being a semiconducting material, then b) remove exposed portions of the structure based on the first material through an opening in a mask formed on the structure, the removal being made by selective etching in the opening of the first material relative to the second material, so as to expose a space around the second bars, then c) form a strained region in the opening by coating the second bars with a given semiconducting material that is strained because its mesh parameter is not the same as the mesh parameter of the second material.

"Bars" means oblong shaped elements such as nanowires or membranes or fins.

Thus, with such a method, after performing step b) to expose these second bars, a strain is applied to a region called the sheath or shell made from a given semiconducting material with a suitable mesh parameter and formed around the second bars.

The structure made in step a) is such that the first bars and the second bars are stacked.

According to another possible embodiment of the method, the second material is based on Si or $Si_{1-x}Ge_x$ (where x>0), the given semiconducting material being based on $Si_{1-y}Ge_y$, where $0 \leq x < y$. In this case, sheaths of given material strained in compression are formed around the second bars, these bars being suitable for forming a P type transistor channel structure, particularly of the PMOS type.

When the given semiconducting material is based on $Si_{1-y}Ge_y$, the concentration y of germanium in the given semiconducting material is advantageously such that y>0.25.

According to another possible embodiment of the method, the second material may be based on silicon germanium while the given semiconducting material is silicon. In this case, the sheath of given material is strained in tension are can be adapted to form an N type transistor channel structure, particularly of the NMOS type.

Advantageously, said alternation is an alternation of silicon based bars and silicon germanium based bars.

The mask can be formed between step a) and step b) by the deposition of a mask layer and an opening can then be made in the mask layer exposing said structure. The formation of this opening may include a step in which a sacrificial gate formed around a region of the stack is removed.

Advantageously, the method further includes a thinning step of said bars.

This facilitates electrical control of the channel structure. Preferably, thinning is done before step b), leading to the formation of a sheath of a given strained semiconducting material around the bars. A thinning step can thus be performed on the second bars after the selective etching step of the first material and before the step in which the given semiconducting material is grown.

The thinning step can be performed for example by thermal oxidation, so as to form an oxide layer around the second bars. Said oxide layer is then removed.

It is also possible to thin using an etching method, particularly of the "Atomic Layer Etching" (ALE) type.

The formation of a transistor can be completed, and in particular a step to form a gate in the opening can be performed, after straining of said structure.

Advantageously, the sheath or shell of the given semiconducting material is kept intact between step c) and the step in which the gate is formed.

In particular, a method without an intermediate heat treatment or thermal annealing step is preferably applied between step c) in which the sheath or shell of the given semiconducting material is formed and the gate formation step. In addition to diffusion of the given semiconducting sheath material in the bars, such thermal annealing could also cause unwanted diffusion of dopants from the source and drain regions to a bars zone that will form a channel structure.

According to one possible embodiment of the method, a sacrificial gate and spacers on each side of the sacrificial gate are formed after formation of a stack of first bars and second bars in step a).

The method may then also include the following steps:
removal of portions of bars located at the ends of the stack on each side of the spacers,
formation of semiconducting source and drain blocks by growth of at least one semiconducting material on each side of the spacers.

Growth advantageously takes place on the end zones of the stack that project beyond the spacers.

This invention also relates to a semiconducting structure made using a method like that described above, and a transistor comprising such a semiconducting structure.

One embodiment of this invention relates to a device provided with a semiconducting structure suitable for making at least one transistor channel, the structure being formed from bars based on a semiconducting material placed vertically in line with each other, each of the semiconducting bars being surrounding by a sheath made of another given semiconducting material with a mesh parameter different from the mesh parameter of said semiconducting material, such that the sheaths based on said semiconducting material are strained.

BRIEF DESCRIPTION OF THE DRAWINGS

This invention will be better understood after reading the description of example embodiments given purely for infor

Identical, similar or equivalent parts of the different figures have the same numeric references to facilitate the comparison between the different figures.

The different parts shown on the figures are not necessarily all at the same scale to make the figures more easily understandable.

Furthermore, in the following description, terms that are dependent on the orientation such as "on", "above", "top", "bottom", "lateral", etc. of a structure should be understood assuming that the structure is oriented as shown on the figures.

DETAILED PRESENTATION OF PARTICULAR EMBODIMENTS

We will now describe an example of a method of fabricating a semiconducting structure provided with a plurality of strained semiconductors suitable for forming at least one transistor channel, with reference to FIGS. 1A-1N, 2, 5A-5C, 6A-6B.

The initial material used in the method is typically a bulk semiconducting substrate 1, for example made of silicon.

A first step is to make at least a stack 3 of bars, also called nanowires, in other words oblong shaped blocks that can be parallelepiped, or have a circular or ellipsoid cross-section, on this substrate 1.

Figure 1A:
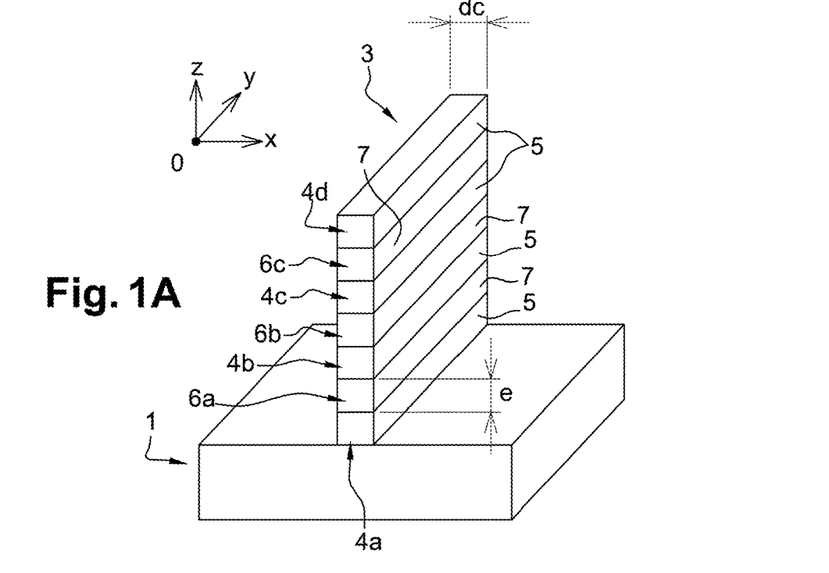
- FIGS. 1A-1N illustrate an example of a method of fabricating a semiconducting structure with superposed bars and comprising a stressed semiconducting sheath.

This stack comprises semiconducting bars with an alternation of bars 4a, 4b, 4c, 4d based on a first material 5 and bars 6a, 6b, 6c based on a second material 7 (FIG. 1A).

The first material 5 is preferably a semiconducting material for example such as silicon germanium ($Si_{1-a}Ge_a$ in which a>0) while the second material 7 is a semiconductor, for example silicon (Si). The first material 5 is a material chosen to have etching selectivity relative to the second material 7. When the second material 7 is made of silicon and the first material 5 is made of $Si_{1-a}Ge_a$, the first material 5 may have a germanium content for example between 5% and 100%, preferably between 20 and 40%.

This germanium content of the first material 5 is chosen such that it can be removed by etching, selectively relative to the second material 7. Advantageously, the Ge concentration in the first material 5 is at least 5% more than the Ge concentration in the second material 7.

The stack of bars can be constructed by firstly fabricating a stack of semiconducting layers, for example formed by epitaxy, an alternation of layers based on the first material 5 and layers based on the second material 7. The next step is to etch this stack of layers through a mask, that might be a hard mask, for example based on silicon nitride. The next step is isotropic etching of zones of the stack of layers not protected by the hard mask.

The bars or nanowires obtained after this etching can thus have a parallelepiped shape with a critical dimension dc equal for example to between 5 nanometers and 40 nanometers. The "critical dimension" is the smallest dimension of a pattern apart from its thickness, the critical dimension dc being measured in a direction parallel to the principal plane of the substrate (i.e. a plane passing through the substrate and that is parallel to the [O; x; y] plane of the [O; x; y; z] orthogonal coordinate system given on FIG. 1A). The thickness e of the bars 4a, 4b, 4c, 4d, 6a, 6b, 6c may for example be between 5 nanometers and 15 nanometers (measured along a direction parallel to the vector z of the [O; x; y; z] orthogonal coordinate system on FIG. 1A).

The next step is to fabricate at least one sacrificial gate 11 on a central region of the stack 3, the sacrificial gate 11 possibly being formed from a layer of dielectric material covered by a gate layer for example such as polysilicon. The sacrificial gate 11, also called the dummy gate, covers the top and lateral flanks of the central region of the stack 3.

Figure 1B:
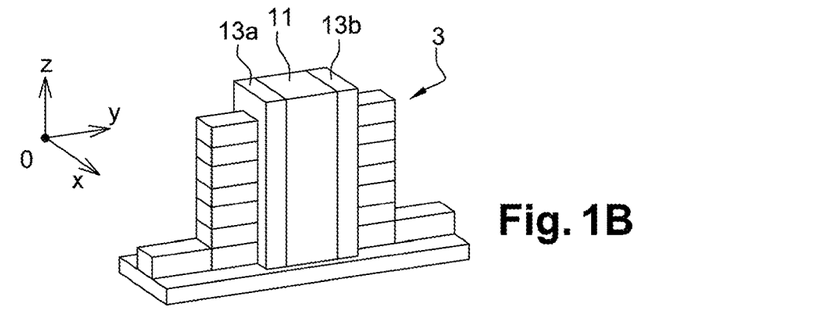

The next step is to form insulating spacers 13a, 13b on each side of the sacrificial gate 11, the insulating spacers coating the stack of semiconducting bars. The insulating spacers 13a, 13b thus cover the top and lateral flanks of the stack 3. The insulating spacers 13b are based for example on silicon nitride. The insulating spacers 13a, 13b and the sacrificial gate 11 thus cover at least a central zone of the stack 3 of semiconducting bars (FIG. 1B).

Anisotropic etching is applied to remove the end portions from the stack of bars of the first material and the second material, in other words from portions located on each side of the spacers 13a, 13b. Etching is preferably made to stop in line with spacers 13a, 13b.

Figure 1C:
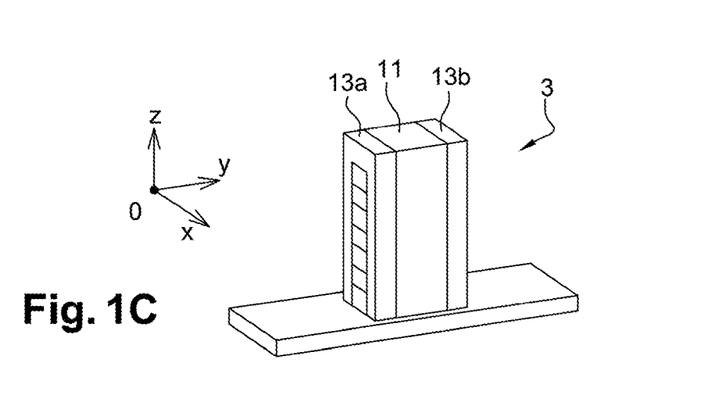

FIG. 1C illustrates the structure after the end portions have been removed.

Internal spacers can then be made, for example as described in document WO 2015/050546 A1.

Figure 5A:
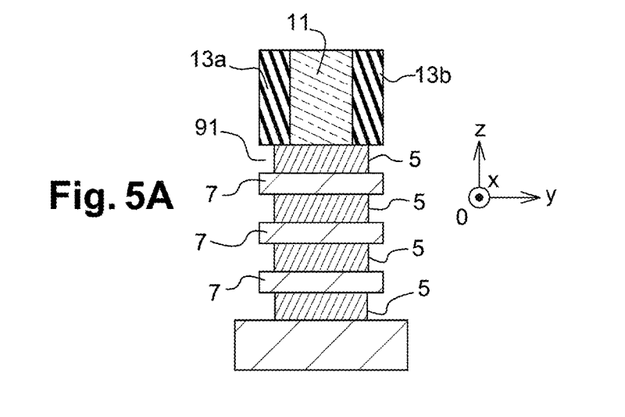
FIGS. 5A-5C and 6A-6B illustrate different examples of a method of making internal spacers for a semiconducting structure with superposed bars.
Figure 5B:
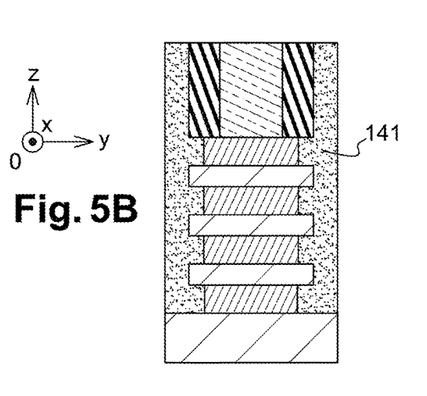
Figure 5C:
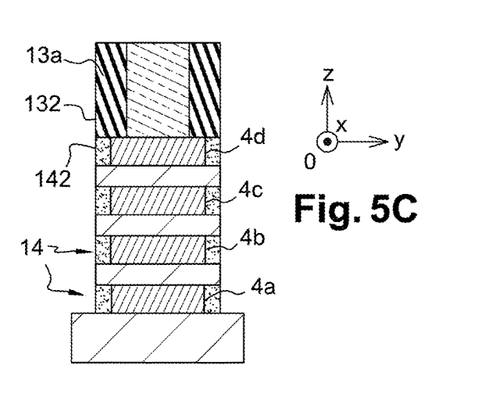

Fabrication steps of the internal spacers are illustrated on FIGS. 5A-5C that contain sectional views of the structure in a cut plane passing through the gate and parallel to the [O; y; z] plane of the [O; x; y; z] coordinate system.

The first step in fabricating internal spacers is selective etching of one of the materials 5, 7 in the stack regions surrounded by the spacers 13a, 13b. In the example illustrated on FIG. 5A, in particular regions of the first material 5 are removed selectively relative to the second material 7.

Removal of the first material 5 exposes cavities 91 or spaces 91 formed in the structure, that are then filled with a dielectric material 141 for example based on silicon nitride (FIG. 5B).

A thickness of this dielectric material 141 can then be removed in zones on each side of the spacers 13a, 13b. This removal is done for example by means of a wet process based on phosphoric acid so as to keep plugs based on the dielectric material 141 around the ends of the bars 4a, 4b, 4c, 4d, 6a, 6b, 6c. These insulating plugs also called "internal spacers' 14 preferably have an external face 142 aligned with an external face 132 of the spacers 13a, as in the example illustrated in FIG. 5c.

Figure 6A:
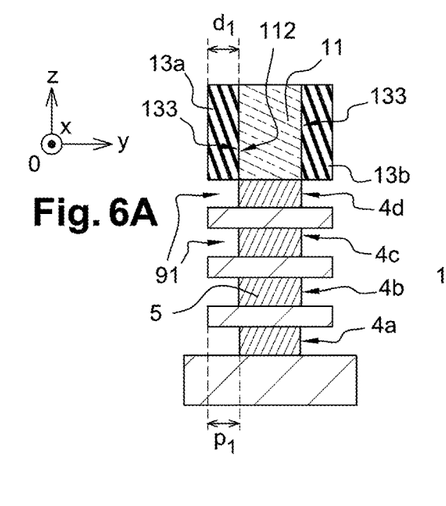
Figure 6B:
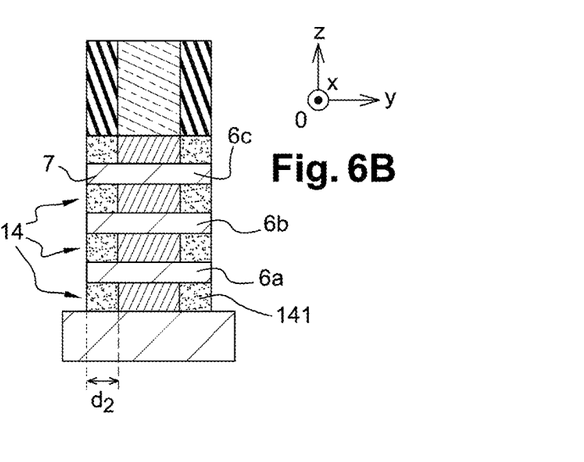

According to one variant embodiment of the internal spacers 14 illustrated on FIGS. 6A-6B, the duration of the selective etching of the first material 5 is chosen such that the ends of the remaining portions of the bars 4a, 4b, 4c, 4d based on the first material 5 are aligned with an interface between an external edge 112 of the sacrificial gate 11 and an internal face 133 of the insulating spacers 13a, 13b. The bars 4a, 4b, 4c, 4d, based on the first material 5 have a footprint or shape in a plane parallel to the principal plane of the substrate 1 reproducing the footprint or shape of the dummy gate parallel to the principal plane of the substrate (FIG. 6A).

Spaces 91 with depth $p_1$ approximately equal to the thickness $d_1$ of the spacers 13a, 13b (the depth $p_1$ and the thickness $d_1$ being dimensions measured parallel to the y axis of the [O; x; y; z] coordinate system) are then filled with a dielectric material 141 to form internal spacers 14 with thickness $d_2$ (dimension also measured parallel to the y axis) equal or approximately equal to the thickness $d_1$ of spacers 13a, 13b. As in the previous example embodiment, a portion of this dielectric material 141 can then be removed in zones located on each side of the spacers 13a, 13b so as to form internal spacers on each side of the bars 4a, 4b, 4c, 4d based on the first material 5, and that surround the ends of the bars 6a, 6b, 6c based on the second material 7 (FIG. 68). The layout of the insulating spacers and the internal spacers is thus defined so as to delimit a location of a future transistor gate. Internal spacers with a thickness $d_2$ corresponding to the thickness of the insulating spacers 13a, 13b can be formed to advantageously achieve a constant gate length over the entire height of the semiconducting structure.

Source and drain blocks 15a, 15b can then be formed. For example, these blocks can be made as described in the publication "Density scaling with gate-all-around silicon nanowire MOSFETs for the 10 nm node and beyond", by S. Bangsaruntip et al., IEDM 2013.

Figure 1D:
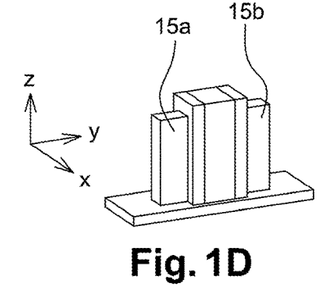
Figure 1E:
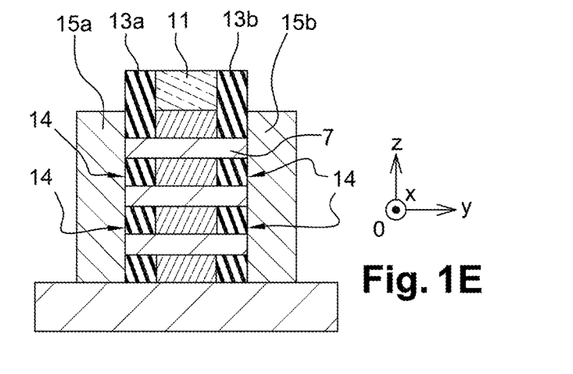
Figure 1F:
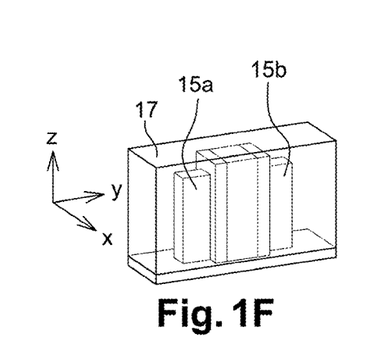
Figure 1G:
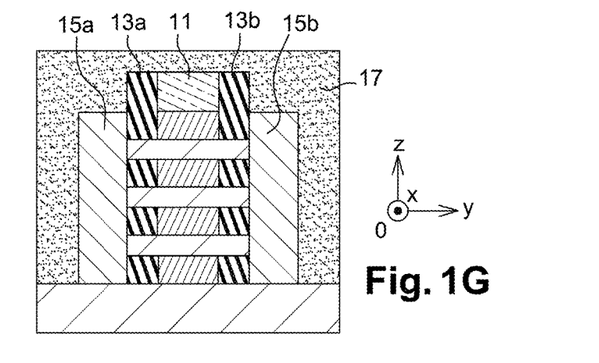

An in-situ doped epitaxial growth step originating at least on a section of bars 6a, 6b, 6c made of a second material 7 can then form semiconducting blocks of uniformly doped source and drain electrodes (FIGS. 1D, 1E).

A mask layer 17 also called an "encapsulation" layer 17 is then formed so as to cover the structure. For example, the mask layer 17 can be based on silicon oxide (FIG. 1F giving a perspective view of the structure and FIG. 1G giving a sectional view on a cut plane parallel to the [O; y; z] plane).

A step to remove this mask layer 17, for example by CMP (Chemical Mechanical Planarisation), can then be performed stopping at the summit or the top face of the sacrificial gate 11.

Figure 1H:
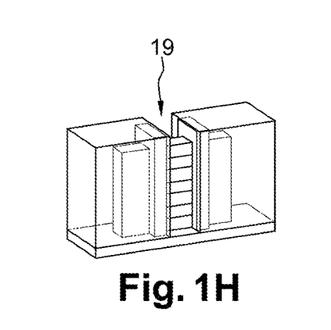
Figure 1I:
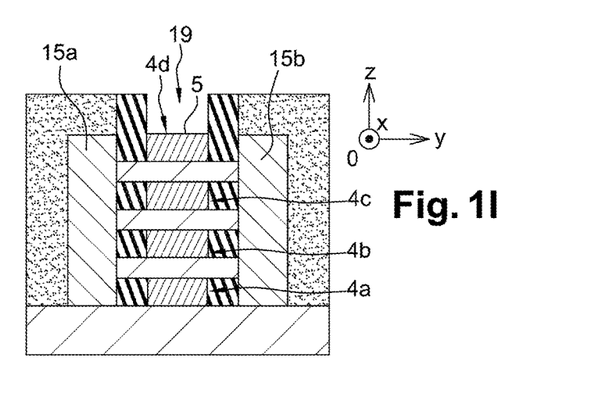

An opening 19 in the mask layer 17 is then made so as to once again expose a central region of the stack of semiconducting bars (FIGS. 1H and 1E). This opening 19 is formed by removing the sacrificial gate 11. When the sacrificial gate 11 is made of polysilicon, it can be removed for example by wet etching using a solution based on ammonia, stopping on the sacrificial gate dielectric, that can then be removed in the opening 19, for example by etching using hydrofluoric acid for the typical case of a dielectric based on silicon oxide.

Figure 1J:
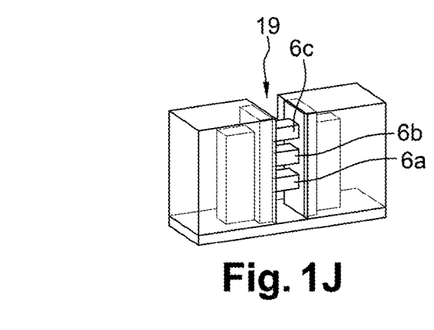
Figure 1K:
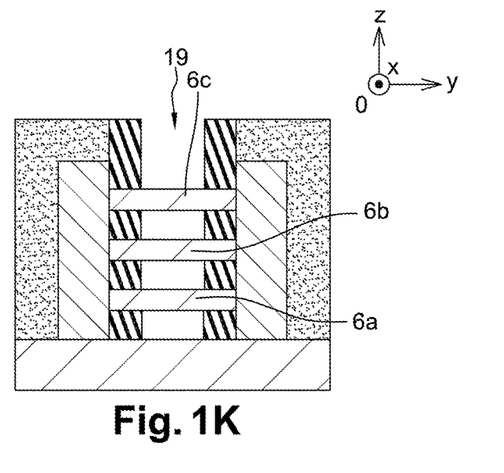

Materials 5, 7 of the exposed region of the stack are then removed in the opening 19. In particular, the first material 5 is selectively removed relative to the second material 7 (FIGS. 1J and 1K). This selective material may for example be removed by chemical vapour phase etching, for example using HCl mixed with a carrier gas or by chemical etching based on $CF_4$, in the case in which the removed material 5 is $Si_{1-a}Ge_a$. The result obtained in the opening 19 is thus suspended bars 6a, 6b, 6c based on the second semiconducting material 7. The bars 6a, 6b, 6c based on the second material 7 advantageously have a central portion that is not covered by another material, such that an empty space is formed around the central portion of the bars 6a, 6b, 6c based on the second semiconducting material 7.

Figure 1L:
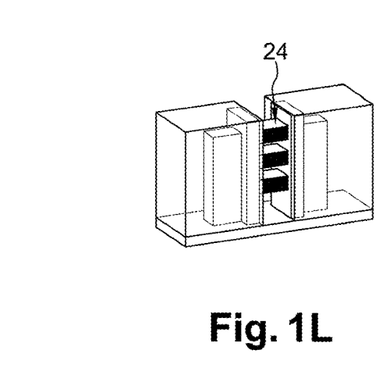
Figure 1M:
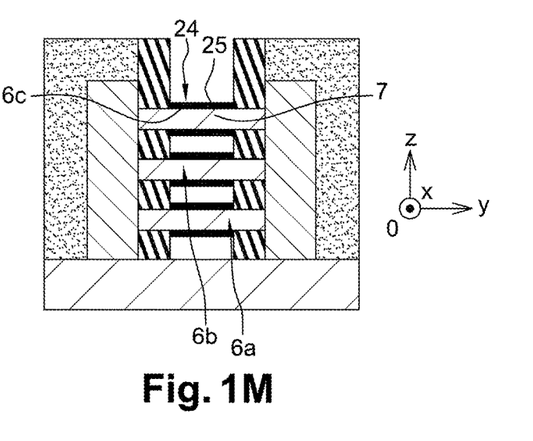

The next step is a chemical vapour deposition to grow a layer 24 of given semiconducting material 25 on portions exposed by the opening 19 in the semiconducting bars 6a, 6b, 6c (FIGS. 1L and 1M). This deposit is preferably selective, the given deposited semiconducting material advantageously being crystalline. In the case of a layer 24 deposited non-selectively, a subsequent step to etch the semiconducting material 25 is performed, for example under HCl or during dilute SC1 cleaning in the case in which the semiconducting material 25 is based on SiGe. The presence of internal spacers 14 contributes to confinement of the layer 24 in a central region of the semiconducting structure.

If the layer 24 is deposited in amorphous form, it is subjected to at least an annealing so that its crystallisation can be controlled. Slow crystallisation is preferred, such that the structure will be as monocrystalline as possible.

When the second semiconducting material 7 is for example made of silicon Si, the given semiconducting material 25 may for example by made of $Si_{1-x}Ge_x$ where x>0 and preferably such that x is equal to at least 25%. The layer 24 may be obtained by epitaxy at a temperature of between 500° C. and 600° C. If the deposit is made at about de 425° C., the deposited material may be amorphous. It is then advantageous to make it crystallise at between 500° C. and 550° C.

The semiconducting material 25 that is grown is a material with a mesh parameter different from the mesh parameter of the second semiconducting material 7. The difference in the mesh parameter between the semiconducting materials 7 and 25 is such that the given semiconducting material 25 is stressed.

When the second material 7 is for example made of silicon Si, the given semiconducting material 25 may for example be made of $Si_{1-x}Ge_x$ in which x>0 and preferably such that x is equal to at least 25%, so as to have a high stress level, for example of the order of between 1 and 2 GPa for a thickness of the layer 24 of the order of 2 nm when the concentration x of germanium is between 25-50%. The stress level is very dependent on the dimensions of the structure. Advantageously, the growth achieved is isotropic, with a similar growth rate on each face of the bars 6a, 6b, 6c, i.e. the lateral, upper and lower faces.

The layer 24 of given semiconducting material 25 preferably covers the entire periphery of the central portion of semiconducting bars 6a, 6b, 6c, so as to form a closed semiconducting contour or a ring, or a "sheath" or "shell" around the central portion of the semiconducting bars 6a, 6b, 6c. The result obtained is thus a core-shell configuration as illustrated on the cross-sectional view in FIG. 2 of a semiconducting bar 6a (forming the core) based on the second material 7 covered over the entire outer surface of its central portion by the layer 24 of given semiconducting material 25 (forming the shell or the sheath).

The next step is to form a replacement gate 30 in the opening 19. A gate stack can be made in a conforming manner, for example by chemical vapour deposition (CVD) of a gate dielectric for example based on $HfO_2$, and at least one gate material, for example formed from a layer containing metal such as TiN or TaN and a layer of semiconducting material such as polysilicon or metal such as tungsten, so as to fill the opening 19.

Figure 1N:
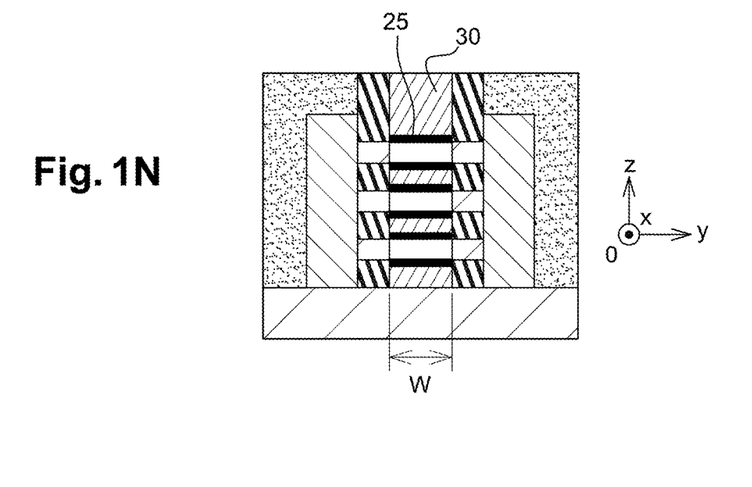
Figure 2:
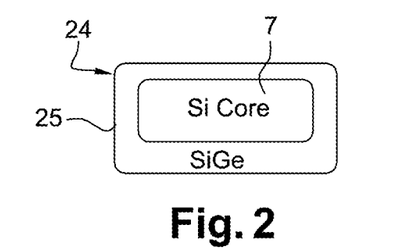
FIG. 2 illustrates an example configuration of semiconducting bars after the formation of a stressed sheath around these bars.

A gate all around is then made, forming a closed contour or a ring around a central portion of the bars 6a, 6b and 6c and the sheath of strained material 25 formed around this central portion (FIG. 1N).

A step can then be performed to remove gate material projecting above the mouth of the opening 19 or the top face of the mask in which this opening 19 is formed, for example by CMP planarisation. At the end of this step, a gate with a length W (measured parallel to the y axis of the [O; x; y; z] coordinate system and corresponding to the channel length) for example equal to between 5 and 50 nm.

The result obtained in this example is a "Gate All Around" (GM) configuration of a semiconducting structure provided with several strained semiconducting elements, particularly strained in compression, suitable for forming at least one transistor channel structure.

Preferably, an annealing or heat treatment step is avoided between formation of the sheath of given semiconducting material 25 and fabrication of the gate 30. Thus, the sheath of strained given semiconducting material 25 can be kept without diffusing this material in the core of the bars 6a, 6b and 6c.

Avoiding thermal annealing with a high budget after the step in which the sheath of the given semiconducting material 25 is formed also prevents unwanted diffusion of dopants in the source and drain electrodes previously formed in the regions of the bars 6a, 6b, 6c.

Figure 4:
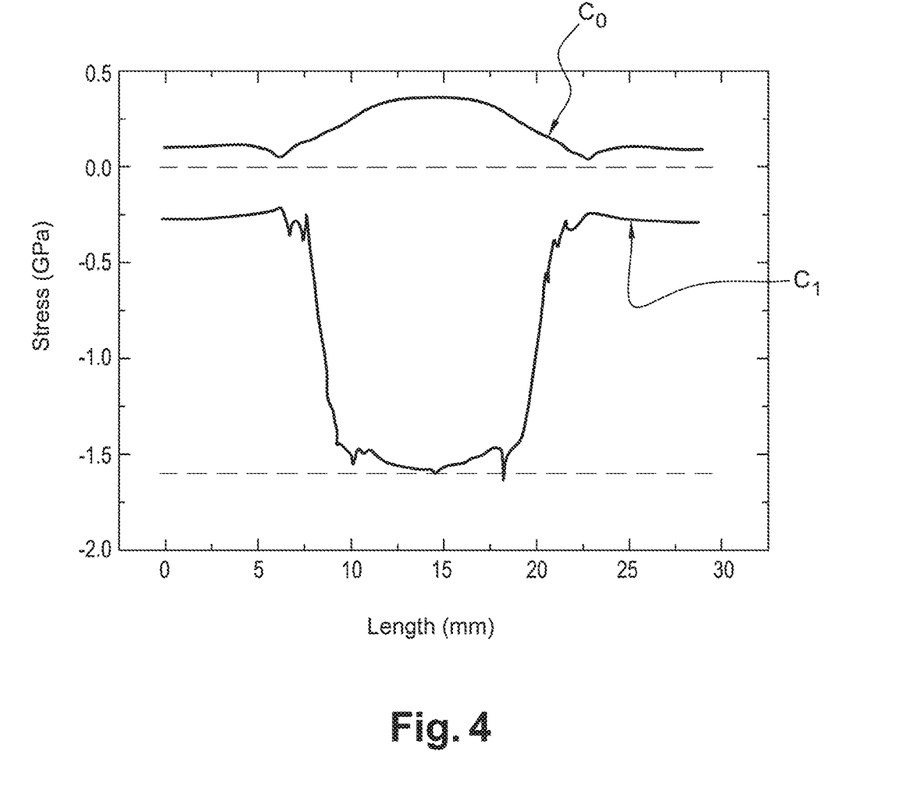
FIG. 4 illustrates an example simulation of a state of stress in a semiconducting structure that could be obtained using a method according to the invention.

On FIG. 4, curves $C_0$, $C_1$ show simulation results of the stress vector along the x axis in a semiconducting structure of the type described with reference to FIG. 1H with 3 silicon bars arranged vertically in line with each other and with a thickness e equal to 6 nm, a critical dimension dc equal to 10 nm (channel width W), and length Lg (corresponding to the channel or grid length) equal to 12 nm, and layers of 30% SiGe. A first curve $C_0$ is representative of a simulated stress state of the structure after the step to expose the silicon bars by selective etching and before growth takes place by epitaxy in the case of a process involving etching of the source and drain regions after formation of the principal spacer, as described in the publication "Density scaling with gate-all-around silicon nanowire MOSFETs for the 10 nm node and beyond", S. Bangsaruntip et al., IEDM 2013. Curve $C_0$ shows that the stress can be slightly tensile, which is bad for a p type transistor.

A second curve $C_1$ is representative of a simulated stress state of the structure after the epitaxial growth step described with reference to FIG. 1J, in this example with a silicon germanium layer with a thickness of the order of 2 nm and a germanium concentration of 30%. The second curve $C_1$ shows that a compression stress of the order of −1.6 GPa can be obtained in the sheath.

A strained bars semiconducting structure can be implemented using different semiconducting materials from those used in the example embodiment given above. For example, bars 6a, 6b and 6c based on silicon germanium ($Si_{1-z}Ge_z$, in which z>0) could also be used, around which a layer of semiconducting material based on $Si_{1-x}Ge_x$ in which x>z and preferably such that x−z>0.1, is formed by epitaxial growth. For example, such a layer may be between 2 nm and 5 nm thick.

This also makes it possible to form a channel structure with semiconducting bars 6a, 6b and 6c with the sheath strained in compression.

According to one variant, bars 6a, 6b, 6c based for example on silicon germanium ($Si_{1-z}Ge_z$ in which z>0) can be formed around which a layer 24 of semiconducting material 25 based on Si is formed by epitaxial growth.

In this case, a channel structure with semiconducting bars 6a, 6b and 6c is made, in this case with the sheath strained in tension. Thus, a method according to the invention can also be applied to the use of at least one channel structure for an N type and particularly NMOS transistor.

The fact of having already fabricated source and drain semiconducting blocks at this stage of the method makes it possible to maintain the strain effect, unlike a method in which the source and drain regions are subsequently replaced.

Figure 3A:
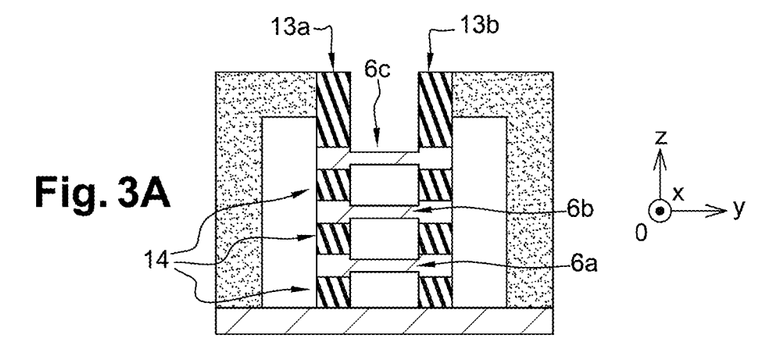
FIGS. 3A-3C illustrate an example embodiment of the semiconducting structure with superposed bars in which bars are thinned before the growth of a semiconducting material with a different mesh parameter so as to obtain a stress around their periphery.

According to one variant embodiment of the examples of the method described above, the suspended semiconducting bars 6a, 6b and 6c are thinned after having been released by selective etching (FIG. 3A). Thinning may be done for example by etching with HCl when the bars 6a, 6b and 6c to be thinned are made of silicon or silicon germanium. Etching by ALE (Atomic Layer Etching) is also possible. For example, ALE etching can be made under a $Cl_2$ atmosphere, alternating adsorption at ambient temperature and desorption at 650° C. The surface of bars 6a, 6b and 6c can also be oxidised to thin them and reduce their volume. An oxidation like this can be done at between 900° C. and 1000° C. and is followed by deoxidation. The internal spacers 14 help to protect the end portions of the suspended semiconducting bars 6a, 6b, 6c during thinning. Protection of portions by which the bars 6a, 6b and 6c attached to the source and drain blocks helps to maintain good anchorage of the bars 6a, 6b and 6c. This results in better mechanical stability of the structure.

Epitaxial growth of the given semiconducting material 25 then takes place in a region located in the opening 19 on a thinned central portion of the bars 6a, 6b and 6c.

The presence of internal spacers 14 participates in confining the given semiconducting material 25 that is grown on a central portion of the bars 6a, 6b and 6c.

The mesh parameter of the material that is grown is different from the mesh parameter of the bars 6a, 6b and 6c, such that the grown material can be strained by the bars. In this example embodiment, a configuration is obtained in which at least a portion of the sheath of the given semiconducting material 25 is aligned with or is located in a plane parallel to the substrate of a region 61 of the bars 6a, 6b and 6c, itself in contact with the source and drain electrodes 15a, 15b. Current circulation in the sheath made of a strained semiconducting material is thus facilitated, in comparison with the case of a layout like that shown on FIG. 1J.

Figure 3B:
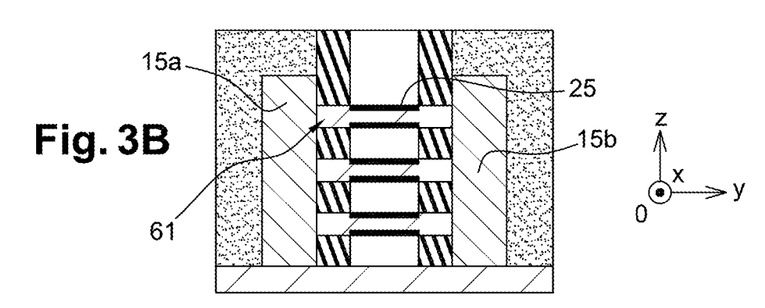

The thickness of given semiconducting material 25 that is made to grow can be selected to be less than or equal (FIG. 3B) to the thickness of material removed during the previously described thinning step.

Figure 3C:
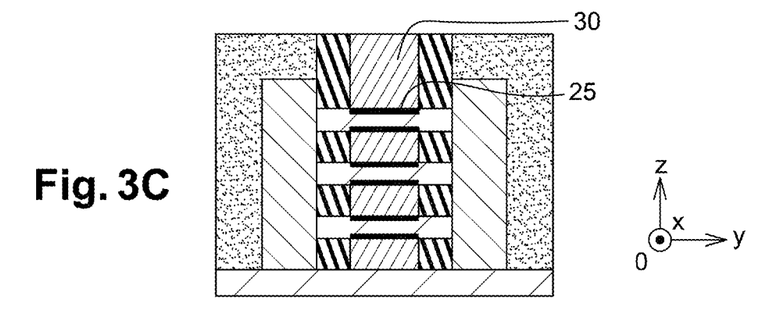

A gate 30 is then form in the opening 19, for example by Chemical Vapour Deposition (CVD) of a gate dielectric based for example on $SiO_2$ and $HfO_2$, and at least one gate material, for example based on a layer of metal such as tungsten or containing a metal based for example on TiN or TaN and/or a layer of doped semiconducting material such as polysilicon (FIG. 3C).

Thinning the bars before formation of the sheath eliminates the need for heat treatment steps after formation of the sheath and that could induce diffusion of the given semiconducting material in the core of the bars 6a, 6b and 6c. Thinning makes it possible to use an improved layout like that illustrated on FIG. 3C in which the outside surface of the sheath and the portions of the bars 6a, 6b and 6c attached to the source and drain blocks are aligned in a direction parallel to the principal plane of the substrate (i.e. a plane parallel to the [O; x; y] plane of the [O; y; y; z] coordinate system. A strained sheath is formed that is not facing the spacers. Thinning the bars before formation of the sheath facilitates the transfer of charge carriers between the source and drain regions and the sheath.

In the example embodiment described above, the stack is made on a solid substrate. However, a method according to the invention could also be adapted on a semiconductor on insulator type substrate, for example a "Silicon On Insulator" (SOI) substrate or a "strained SOI' (sSOI) substrate formed from a semiconducting layer based for example on Si covered with an insulating layer for example based on $SiO_2$, itself covered by a surface semiconducting layer.

A method according to the invention can be adapted to the use of transistors based on advanced technological nodes, particularly with a channel or gate length of less than 20 nm.

A transistor structure with strained semiconducting bars like that described above can be integrated into a high performance and low consumption logic circuit, for example in a NAND type flash memory or in a molecular memory.

The invention claimed is:

1. A Method for fabricating a structure with semiconducting bars suitable for forming at least one transistor channel, including:
 providing at least a semiconducting structure on a substrate, composed of an alternation of first bars based on at least a first material and second bars based on at least a second material, the second material being a semiconducting material, the first bars and the second bars being stacked, then
 forming a sacrificial gate and first insulating spacers on each side of the sacrificial gate, then
 removing regions of the stack located on each side of the insulating spacers, then
 removing end portions from the first bars by selective etching of the first material relative to the second material so as to expose spaces around the ends of the second bars,
 forming of internal spacers in said spaces around said ends of the second bars, then
 forming of semiconducting source and drain blocks by growth of at least one semiconducting material on each side of the insulating spacers and the internal spacers, then,
 removing exposed portions of the structure based on the first material through an opening in a mask formed on the structure, the removal being made by selective etching in the opening of the first material relative to the second material, so as to expose a space around a central portion of the second bars, then
 growing or depositing a layer of a semiconducting material around the second bars in the opening such that the semiconducting material is in contact with the second bars, the semiconducting material having a mesh parameter different from the mesh parameter of the second material so as to induce a strain on the layer of the semiconducting material.

2. The method according to claim 1, wherein the second material is based on Si or $Si_{1-x}Ge_x$ (where x>0), the semiconducting material being based on $Si_{1-y}Ge_y$, where $0 \leq x < y$.

3. The method according to claim 2, wherein the concentration y of germanium in the semiconducting material is such that y>0.25.

4. The method according to claim 1, wherein the second material is based on silico-germanium, the semiconducting material being silicon.

5. The method according to claim 1, wherein said alternation is an alternation of silicon based bars and silicon germanium based bars.

6. The method according to claim 1, further comprising forming a mask between the providing at least the semiconducting structure on the substrate and the removing the exposed portions of the structure based on the first material by depositing a mask layer and then making an opening in the mask layer exposing said structure, forming said opening including removing a sacrificial gate formed around a region of the stack.

7. The method according to claim 1, further including thinning the second bars, after the removing the portions of the structure so as to expose the space around the central portion of the second bars and before the growth or deposit, in the opening, of the semiconducting material.

8. The method according to claim 7, wherein the second bars are thinned so as to remove a given thickness of said second material, the growth or deposit of said semiconducting material being done so as to form a sheath of the semiconducting material corresponding to said given removed thickness.

9. The method according to claim 7, said spaces created around said ends of the second bars having a depth $p_1$ equal to the thickness $d_1$ of the insulating spacers.

10. The method according to claim 1, further comprising, after the growth or deposit of the semiconducting material in the opening, forming a gate in the opening.

* * * * *